(12) United States Patent
Lee (10) Patent No.: US 8,546,788 B2
(45) Date of Patent: Oct. 1, 2013

(54) NONVOLATILE MEMORY DEVICE HAVING DIELECTRIC LAYER FORMED ON CONTROL GATE SIDEWALL ALONG LATERAL DIRECTION

(71) Applicant: Hynix Semiconductor Inc., Icheon-si (KR)

(72) Inventor: Yun Kyoung Lee, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 13/656,120

(22) Filed: Oct. 19, 2012

(65) Prior Publication Data

US 2013/0087847 A1 Apr. 11, 2013

Related U.S. Application Data

(62) Division of application No. 13/028,364, filed on Feb. 16, 2011, now Pat. No. 8,318,591.

(30) Foreign Application Priority Data

Feb. 17, 2010 (KR) .................................. 2010-14120

(51) Int. Cl.
*H01L 21/20* (2006.01)
*H01L 29/775* (2006.01)
*B82Y 40/00* (2011.01)

(52) U.S. Cl.
USPC ............. 257/29; 438/478; 977/842; 977/742

(58) Field of Classification Search
CPC ..... H01L 27/115; H01L 29/792; H01L 21/28; H01L 21/762; H01L 21/824; H01L 21/8247
See application file for complete search history.

(56) References Cited

U.S. PATENT DOCUMENTS

2012/0012916 A1 1/2012 Aoyama et al.
2012/0122294 A1* 5/2012 Kamioka et al. .............. 438/424

FOREIGN PATENT DOCUMENTS

| KR | 10-2005-0002424 | 1/2005 |
|---|---|---|
| KR | 10-2006-0133166 | 12/2006 |
| KR | 10-2007-0067456 | 6/2007 |

\* cited by examiner

*Primary Examiner* — Walter H Swanson
(74) *Attorney, Agent, or Firm* — Marshall, Gerstein & Borun LLP (57) ABSTRACT

Patterns of a nonvolatile memory device include a semiconductor substrate including active regions extending in a longitudinal direction, an isolation structure formed between the active regions, a tunnel insulating layer formed on the active regions, a charge trap layer formed on the tunnel insulating layer, a first dielectric layer formed on the charge trap layer and the isolation structure, wherein the first dielectric layer is extended along a lateral direction, a control gate layer formed on the first dielectric layer, wherein the control gate layer is extended along the lateral direction, and a second dielectric layer formed on a sidewall of the control gate layer along the lateral direction and coupled to the first dielectric layer.

8 Claims, 10 Drawing Sheets

NONVOLATILE MEMORY DEVICE HAVING DIELECTRIC LAYER FORMED ON CONTROL GATE SIDEWALL ALONG LATERAL DIRECTION

CROSS-REFERENCE TO RELATED APPLICATION

This is a division of U.S. application Ser. No. 13/028,364 filed Feb. 16, 2011, which claims the priority benefit under Korean patent application number 10-2010-0014120 filed Feb. 17, 2010, the entire respective disclosures of which are incorporated herein by reference.

BACKGROUND

Exemplary embodiments relate generally to the patterns of a nonvolatile memory device and a method of forming the same and, more particularly, to the patterns of a nonvolatile memory device and a method of forming the same, which are capable of improving the failure rate of the device.

In line with an increase in the degree of integration of nonvolatile memory devices and a reduction of the pitch between memory cells, the proportion of defective devices produced in a process of forming patterns constituting a nonvolatile memory device has increased. In particular, a NAND flash memory device having a structure advantageous to a high degree of integration is increasingly likely to have failures in a process of forming gate patterns.

Figure 1:
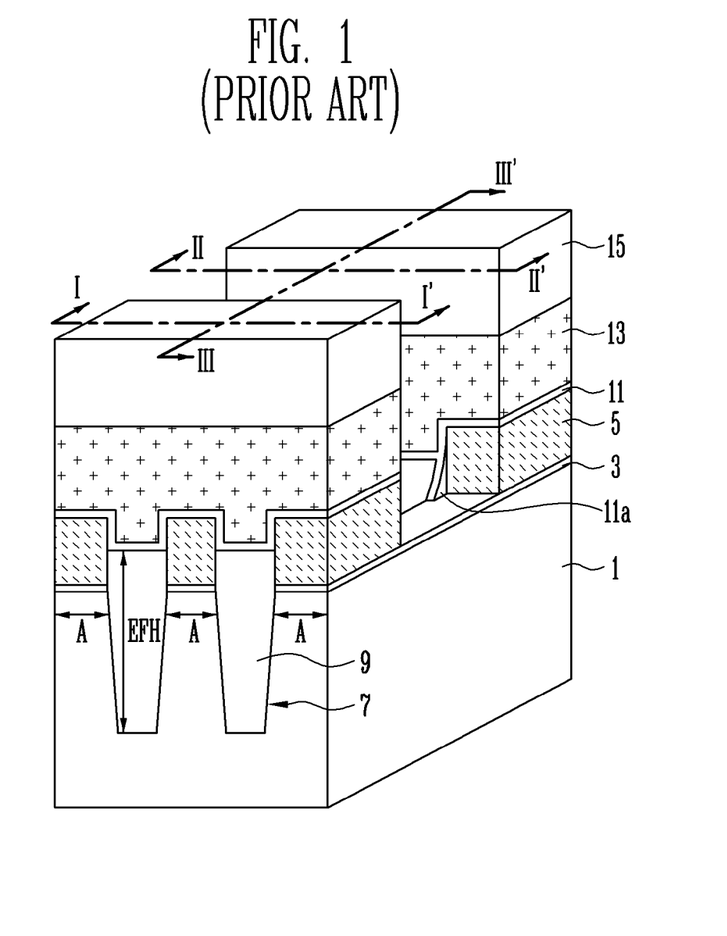
FIG. 1 is a depiction illustrating a method of forming the patterns of a nonvolatile memory device.
Figure 2A:
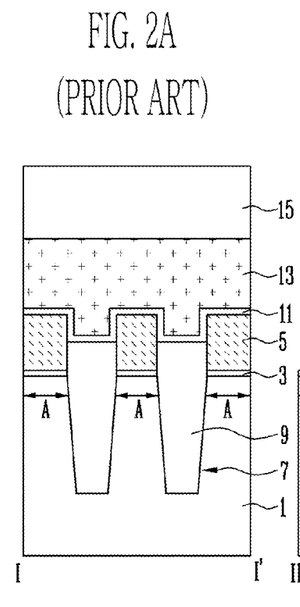
FIG. 2 is a cross-sectional view taken along lines I-I', II-II', and III-III'in FIG. 1.
Figure 2B:
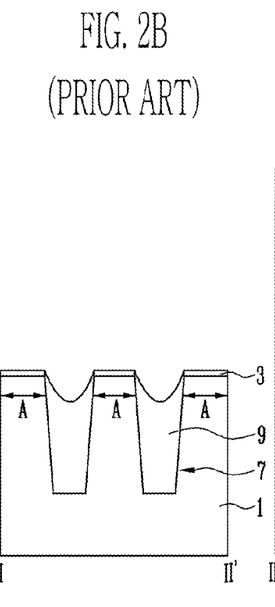
Figure 2C:
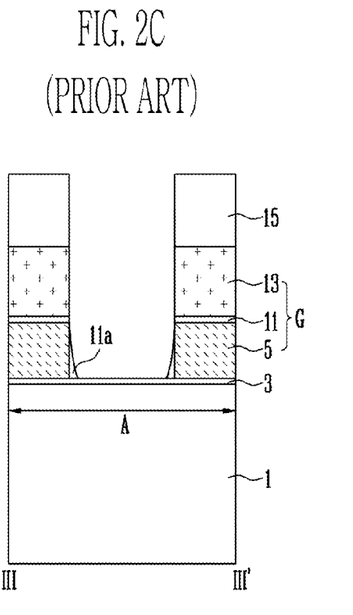

FIGS. 1, 2A, 2B, and 2C are diagrams illustrating a known method of forming the patterns of a nonvolatile memory device. In particular, FIGS. 1 and 2 depict a method of forming the gate patterns of a NAND flash memory device. FIGS. 2A, 2B, and 2C are cross-sectional views taken along lines I-I', II-II', and III-III', respectively, in FIG. 1.

Referring to FIG. 1, and FIGS. 2A, 2B, and 2C a tunnel insulating layer 3 and a charge trap layer 5 are stacked over a semiconductor substrate 1. The charge trap layer 5 and the tunnel insulating layer 3 are etched so that the semiconductor substrate 1 is exposed in the longitudinal direction. Next, trenches 7 are formed in the semiconductor substrate 1 in a longitudinal direction by etching the exposed semiconductor substrate 1. Although not shown, the process of etching the charge trap layer 5 and the tunnel insulating layer 3 and the process of etching the exposed semiconductor substrate 1 may be performed by using isolation hard mask patterns, formed on the charge trap layer 5, as an etch mask before the charge trap layer 5 is formed. The isolation hard mask patterns may be removed after the trenches 7 are formed.

After the trenches 7 are formed, the trenches 7 are filled with isolation insulation layers 9. Isolation structures, including the trenches 7 and the isolation insulation layers 9 and electrically isolating memory cells, are formed. An active region A is defined between the isolation structures in the longitudinal direction. The tunnel insulating layer 3 and the charge trap layer 5 may remain only over the active regions A.

Next, the height of the isolation insulation layer 9 is lowered by etching the isolation insulation layers 9 to control the Effective Field oxide Height (EFH) of the isolation structure. The EFH of the isolation structure is preferably lower than the height of the charge trap layer 5 such that the area in which the charge trap layer 5 and a control gate layer 13, forming a gate pattern, come into contact with each other is increased and thus the coupling ratio between the charge trap layer 5 and the control gate layer 13, forming the gate pattern, can be improved. Furthermore, the EFH of the isolation structure is preferably higher than the height of the tunnel insulating layer 3 to prevent the occurrence of a leakage current because the active regions A of the semiconductor substrate 1 are exposed. If the EFH is controlled as described above, the sidewall of the charge trap layer 5 is exposed.

Next, a dielectric layer 11 is formed on the isolation insulation layer 9 and the exposed surface of the charge trap layer 5. Next, the control gate layer 13 of a thickness enough to fill the space between the charge trap layers 5 is formed on the dielectric layer 11. Next, a gate hard mask pattern 15 is formed on the control gate layer 13.

The gate hard mask pattern 15 comprises a plurality of patterns separated in parallel, which is formed to cross the isolation structures and the active regions A. The control gate layer 13, the dielectric layer 11, and the charge trap layers 5 are etched using the gate hard mask pattern 15 as an etch mask to pattern the control gate layer 13, the dielectric layer 11, and the charge trap layers 5. Accordingly, as shown in FIG. 2, gate patterns G in each of which the control gate layer 13, the dielectric layer 11, and the charge trap layer 5 are stacked are formed in respective regions in which the gate hard mask pattern 15 and the active region A cross each other. Meanwhile, the control gate layers 13 of the gate patterns G are connected in the lateral direction to cross the active regions A, thus becoming word lines.

The device can be properly driven when the control gate layer 13, the dielectric layer 11, and the charge trap layer 5 not overlapping the gate hard mask patterns 15 are fully removed in the process of patterning the control gate layer 13, the dielectric layer 11, and the charge trap layer 5 using the gate hard mask pattern 15 as the etch mask. However, the dielectric layer 11, formed on the sidewall of the charge trap layer 5 and over the isolation structure having a controlled EFH, is not fully removed, so that a dielectric fence 11a is formed. The dielectric fence 11a provides a charge transfer path, thus causing a bridge between the gate patterns G that should be electrically insulated. To prevent the dielectric fence 11a from being formed, the dielectric layer 11 may be excessively etched by using the gate hard mask pattern 15 as an etch mask. In this case, however, the isolation insulation layers 9 are excessively etched, and thus the EFH of the isolation structure may be lost.

The dielectric fence 11a causes not only a bridge between the gate patterns G, but also the deterioration of a cycling characteristic of the device. The loss of the EFH causes reduction in reliability of the device. Furthermore, the dielectric fence 11a, together with the gate hard mask pattern 15, serves as an etch mask to prevent the charge trap layer 5 below the dielectric fence 11a from being removed, thereby causing failure of the gate patterns G.

BRIEF SUMMARY

Exemplary embodiments relate to the patterns of a nonvolatile memory device and a method of forming the same, which are capable of easily removing the unnecessary region of a dielectric layer, by removing the unnecessary region without the loss of the EFH of an isolation structure and preventing the unnecessary region from being formed on the sidewall of a charge trap layer.

According to an aspect of this disclosure, there are provided patterns of a nonvolatile memory device, including a semiconductor substrate that defines active regions extending in a longitudinal direction, an isolation structure formed between the active regions, a tunnel insulating layer formed on the active regions, a charge trap layer formed on the tunnel insulating layer, a first dielectric layer formed on the charge trap layer and the isolation structure, wherein the first dielectric layer is extended along a lateral direction, a control gate layer formed on the first dielectric layer, wherein the control gate layer is extended along the lateral direction, and a second dielectric layer formed on a sidewall of the control gate layer along the lateral direction and coupled to the first dielectric layer.

According to another aspect of this disclosure, there is provided a method of forming patterns of a nonvolatile memory device, including providing a semiconductor substrate that defines active regions extending in a longitudinal direction, an isolation structure between the active regions and a tunnel insulating layer and a charge trap layer stacked over the active regions; forming a plurality of auxiliary patterns spaced apart from each other in the longitudinal direction over the charge trap layer and the isolation structure so that the charge trap layer and the isolation structure are exposed along a lateral direction; forming a dielectric layer over the charge trap layer and the isolation structure exposed by the auxiliary patterns and on surfaces of the auxiliary patterns; forming a first control gate layer on the dielectric layer; polishing the first control gate layer and the dielectric layer to expose the auxiliary patterns; and removing the auxiliary patterns to expose the charge trap layer.

The dielectric layer preferably comprises a nitride layer.

The method preferably further includes lowering the height of the isolation structure by etching the isolation structure exposed by the auxiliary patterns, before forming the dielectric layer.

When lowering the height of the isolation structure, the height of the isolation structure preferably is higher than the tunnel insulating layer, and lower than a top surface of the charge trap layer.

The method preferably further includes exposing a sidewall of the first control gate layer by etching the exposed portion of the dielectric layer, after removing the auxiliary patterns.

When exposing the sidewall of the first control gate layer, the sidewall of the first control gate layer preferably is exposed by a thickness of the charge trap layer or by a thickness thicker than the thickness of the charge trap layer from a top of the first control gate layer.

The method preferably further includes etching the exposed portion of the charge trap layer by using the first control gate layer and the dielectric layer as an etch mask, after exposing the sidewall of the first control gate layer.

When etching the exposed portion of the charge trap layer, the first control gate layer preferably is etched and the first control gate layer preferably has a reduced thickness.

After etching the exposed portion of the charge trap layer, the method preferably further includes forming a dielectric interlayer over the semiconductor substrate, exposing the first control gate layer by etching the dielectric interlayer, forming a metal layer on the exposed portion of the first control gate layer, forming second control gate layer comprising a metal silicide layer by reacting the metal layer and the first control gate layer, and removing the metal layer remaining after forming the metal silicide layer.

When exposing the first control gate layer by etching the dielectric interlayer, the dielectric interlayer preferably is etched to expose the sidewall of the first control gate layer.

The exposed sidewall of the first control gate layer from the top of the first control gate layer preferably is thicker than the charge trap layer.

When the dielectric layer is exposed, the etching of the dielectric interlayer preferably is stopped because of a difference in an etch selectivity between the dielectric interlayer and the dielectric layer.

The first control gate layer preferably comprises polysilicon, and the metal layer preferably comprises cobalt (Co).

BRIEF DESCRIPTION OF THE DRAWINGS

FIGS. 3A to 3J are depictions illustrating the patterns of a nonvolatile memory device and a method of forming the same according to a first exemplary embodiment of this disclosure;

FIGS. 5A to 5F are depictions illustrating the patterns of a nonvolatile memory device and a method of forming the same according to a second exemplary embodiment of this disclosure.

DESCRIPTION OF EMBODIMENTS

Hereinafter, some exemplary embodiments of the disclosure are described in detail with reference to the accompanying drawings. The drawing figures are provided to allow those having ordinary skill in the art to understand the scope of the embodiments of the disclosure.

FIGS. 3A to 3J are depictions illustrating the patterns of a nonvolatile memory device and a method of forming the same according to a first exemplary embodiment of this disclosure. In particular, FIGS. 3A to 3J illustrate the gate patterns of a NAND flash memory device and a method of forming the same.

Figure 3A:
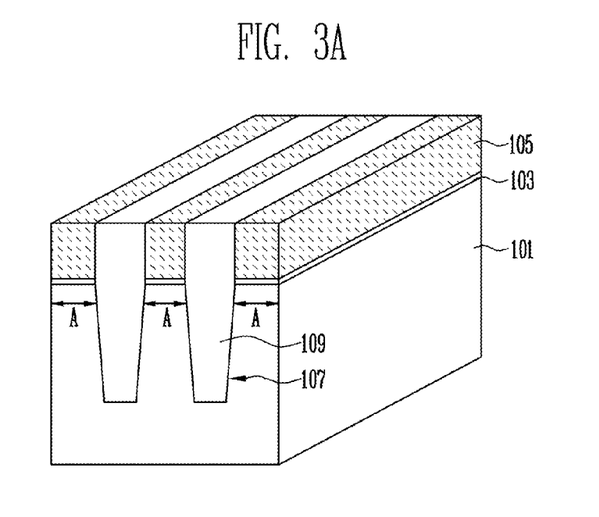

Referring to FIG. 3A, an active regions A are defined extending in a longitudinal direction. A semiconductor substrate 101 in which a isolation structure is formed between the active regions A, and a tunnel insulating layer 103 and a charge trap layer 105 are stacked over the active regions A is provided.

The semiconductor substrate 101 may be formed through the following process.

First, a well (not shown) is formed. The tunnel insulating layer 103, the charge trap layer 105, and isolation hard mask patterns (not shown) are stacked over the semiconductor substrate 101 on which an ion implantation process for controlling the threshold voltage has been performed.

The tunnel insulating layer 103 preferably comprises an oxide layer, and may be formed using an oxidization process or a deposition process. The charge trap layer 105 preferably comprises a polysilicon layer. The isolation hard mask patterns preferably comprise an oxide layer, or may have a stack structure of an oxide layer and a nitride layer, for example.

The isolation hard mask patterns define regions in which the trenches 107 of isolation structures will be formed. The isolation hard mask patterns are spaced from each other in the lateral direction and are formed along the longitudinal direction. The tunnel insulating layer 103 is exposed by etching the exposed charge trap layer 105 using the isolation hard mask patterns as an etch mask. Next, the semiconductor substrate 101 is exposed by etching the exposed tunnel insulating layer 103 using the isolation hard mask patterns as an etch mask. Next, the plurality of trenches 107 spaced apart from each other in the lateral direction is formed by etching the exposed semiconductor substrate 101 to a desired depth using the isolation hard mask patterns as an etch mask. After the trenches 107 are formed, the isolation hard mask patterns may be removed.

After the trenches 107 are formed, isolation insulation layer 109, having a thickness sufficient to fill the inside of the trench 107, is formed on the entire surface. Next, a polishing process is performed to expose the charge trap layer 105. The polishing process preferably is performed using Chemical Mechanical Polishing (CMP). Accordingly, the isolation insulation layer 109 is separated in the lateral direction and has the same height as the charge trap layer 105. The isolation structure, including the isolation insulation layer 109 and the trench 107. The isolation structures are spaced apart from each other in the lateral direction. Furthermore, the active region A of the semiconductor substrate 101 is defined between the isolation structures along the longitudinal direction. The tunnel insulating layer 103 and the charge trap layer 105 remain only over the active regions A.

Figure 3B:
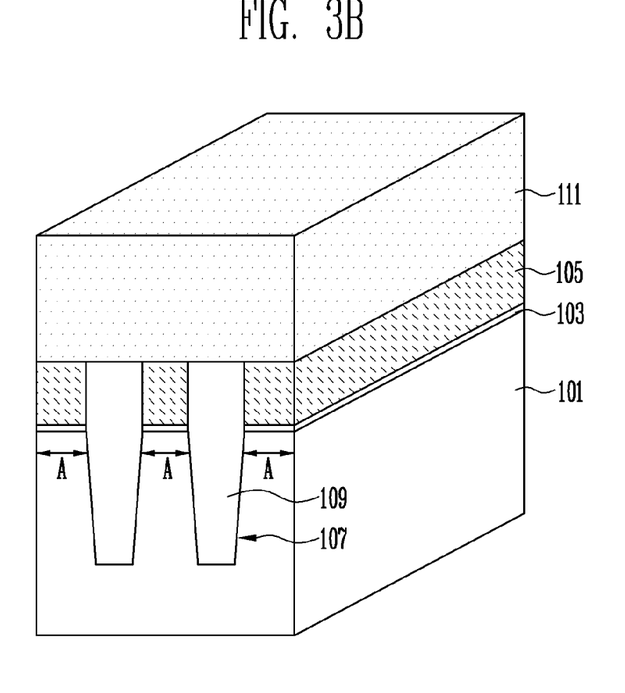

Referring to FIG. 3B, an auxiliary layer 111 is formed on the charge trap layer 105 and the isolation insulation layer 109. The auxiliary layer 111 preferably comprises an oxide layer that can be easily etched. The oxide layer preferably includes at least any one of a High Density Plasma (HDP) oxide layer, a Plasma Enhanced-Tetra Ethyl Ortho Silicate (PE-TEOS) oxide layer, a High Temperature Oxide (HTO) layer, or a Boro-phospho Silicate Glass (BPSG) oxide layer.

The thickness of the auxiliary layer 111 preferably is the same as the sum of the thickness of the charge trap layer 105, the thickness of a control gate layer remaining as a control gate pattern, and the thickness of the isolation insulation layer 109 to be etched in a subsequent process.

Figure 3C:
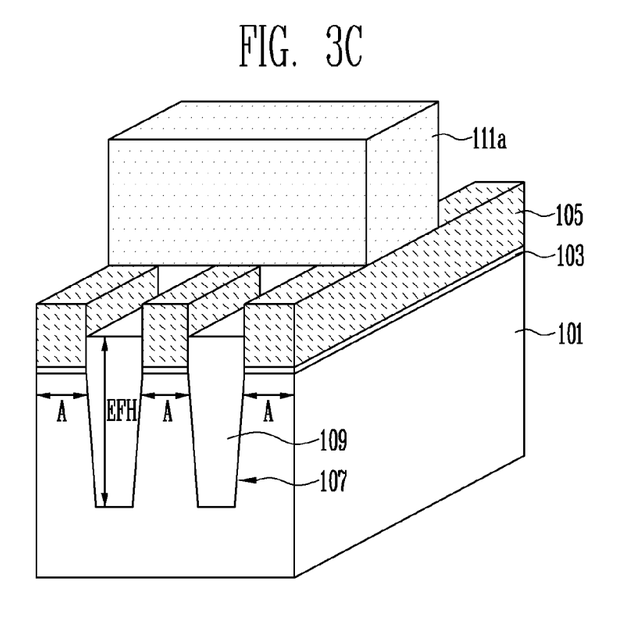

Referring to FIG. 3C, auxiliary patterns 111a are formed by patterning the auxiliary layer 111. The auxiliary patterns 111a are formed on the isolation insulation layer 109 and the charge trap layer 105 and spaced apart from each other in the longitudinal direction so that the isolation insulation layer 109 and the charge trap layer 105 are exposed along the lateral direction. Only one auxiliary pattern 111a is shown in relevant drawings, for convenience of description.

Meanwhile, the auxiliary patterns 111a are formed in regions in which a control gate layer and a dielectric layer to be formed in subsequent processes should not remain and formed of patterns to define regions in which the control gate layer and the dielectric layer remain. Thus, after gate patterns are finally formed, the control gate layer and the dielectric layer remain only over the semiconductor substrate 101 corresponding to a region in which the auxiliary pattern 111a is not formed.

The height of the isolation insulation layer 109 by an etch process, such as etch-back process, is lowered by using the auxiliary patterns 111a as an etch mask to control the effective field oxide height (EFH) of the isolation structure. The height of the isolation structure preferably is lower than the height of the charge trap layer 105 so that the area in which the charge trap layer 105 and the control gate layer, forming the gate pattern, come into contact with each other is increased and thus the coupling ratio between the charge trap layer 105 and the control gate layer can be improved. Furthermore, the height of the isolation structure preferably is higher than the height of the tunnel insulating layer 103 to prevent the leakage current from being generated owing to the exposed active regions A.

As a result of the etch process of controlling the EFH of the isolation structure, the sidewall of the charge trap layer 105 is exposed only in portion exposed by the auxiliary patterns 111a, some of the auxiliary patterns 111a is etched, and thus the thickness of the auxiliary pattern 111a can be reduced.

Figure 3D:
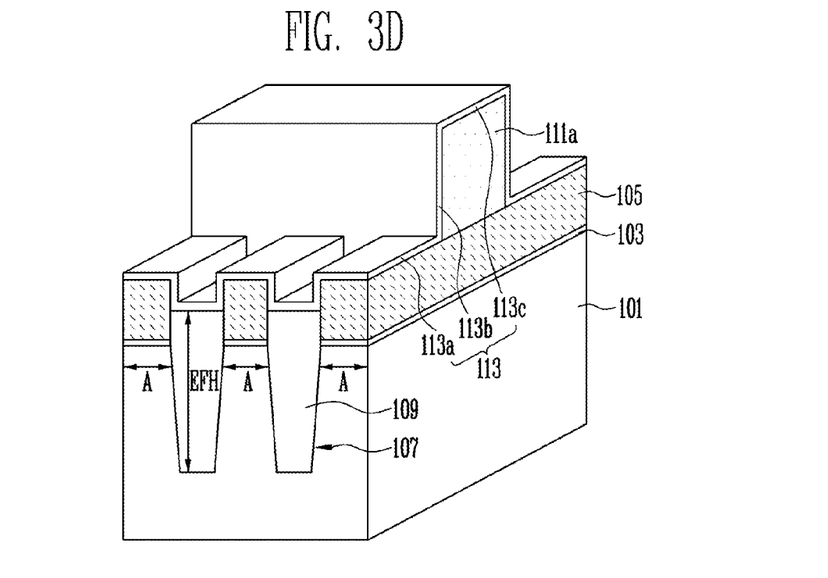

Referring to FIG. 3D, a dielectric layer 113 is formed on the exposed sidewall of the charge trap layer 105, the exposed top of the charge trap layer 105, on the top of the auxiliary pattern 111a, and on the sidewall of the auxiliary pattern 111a.

The dielectric layer 113 preferably has a stack structure of a first oxide layer, a nitride layer, and a second oxide layer. As shown herein, the dielectric layer 113 includes a first dielectric layer 113a, a second dielectric layer 113b, and a third dielectric layer 113c. The first dielectric layer 113a is formed on the exposed surface of the isolation insulation layer 109, the sidewall of the charge trap layer 105 protruding higher than the isolation insulation layer 109 having a lowered height, and on the exposed top of the charge trap layer 105. The second dielectric layer 113b is coupled to the first dielectric layer 113a and is formed on the sidewall of the auxiliary pattern 111a extending in the lateral direction. The third dielectric layer 113c is coupled to the second dielectric layer 113b and formed on the top of the auxiliary pattern 111a.

Figure 3E:
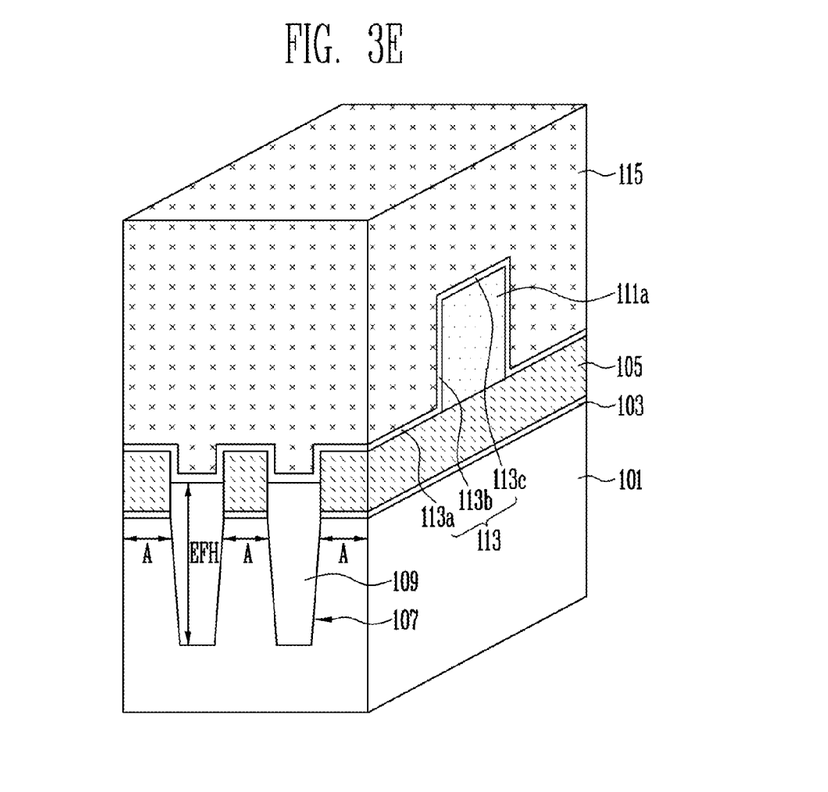

Referring to FIG. 3E, the control gate layer 115 is formed on the dielectric layer 113.

The control gate layer 115 is formed in thickness sufficient to fill the space between the charge trap layers 105 and thicker than the charge trap layer 105 by taking the loss of the control gate layer 115 in a subsequent process of etching the charge trap layer 105 into consideration. To this end, the control gate layer 115 preferably is thicker than the sum of the thickness of the charge trap layer 105 and the thickness of the control gate layer 115 that should remain as the gate pattern.

Figure 3F:
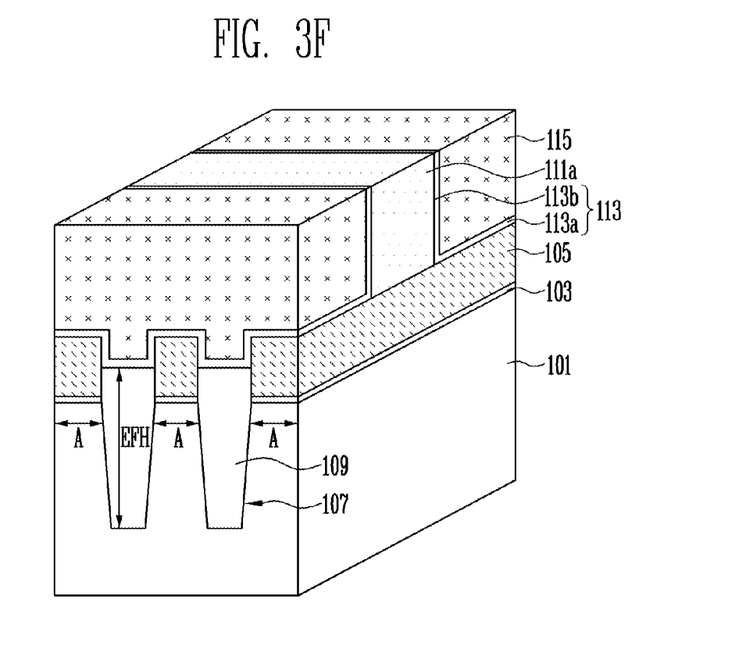

Referring to FIG. 3F, the control gate layer 115 and the dielectric layer 113 are polished to expose the auxiliary pattern 111a. The polishing preferably is performed using Chemical Mechanical Polishing (CMP).

When the auxiliary pattern 111a is exposed by polishing the control gate layer 115 and the dielectric layer 113, the third dielectric layer 113c is removed and only the first and second dielectric layers 113a and 113b remain. Furthermore, the control gate layers 115 are spaced apart from each other in the longitudinal direction, and the second dielectric layer 113b remains only on the sidewall of the control gate layer 115 along the lateral direction.

Meanwhile, the third dielectric layer 113c that is removed is not formed on the sidewall of the charge trap layer 105, but formed on the top of the auxiliary pattern 111a, which is parallel to the semiconductor substrate 101 and flat. Accordingly, the third dielectric layer 113c can be easily removed through the polishing process. Since the third dielectric layer 113c can be easily removed by the polishing process as described above, an excessive etch process for removing the unnecessary third dielectric layer 11c need not be performed. Furthermore, there is no problem that the height of the isolation insulation layer 109 will be lost because the isolation insulation layer 109 is not lost in the process of removing the third dielectric layer 113c. Accordingly, a shift in the EFH of the isolation structure can be prevented. Furthermore, the irregularity of the program speeds of memory cells, occurring due to a change in the coupling ratio of the gate pattern for every memory cell because of irregular EFHs of the isolation structures, can be prevented.

Figure 3G:
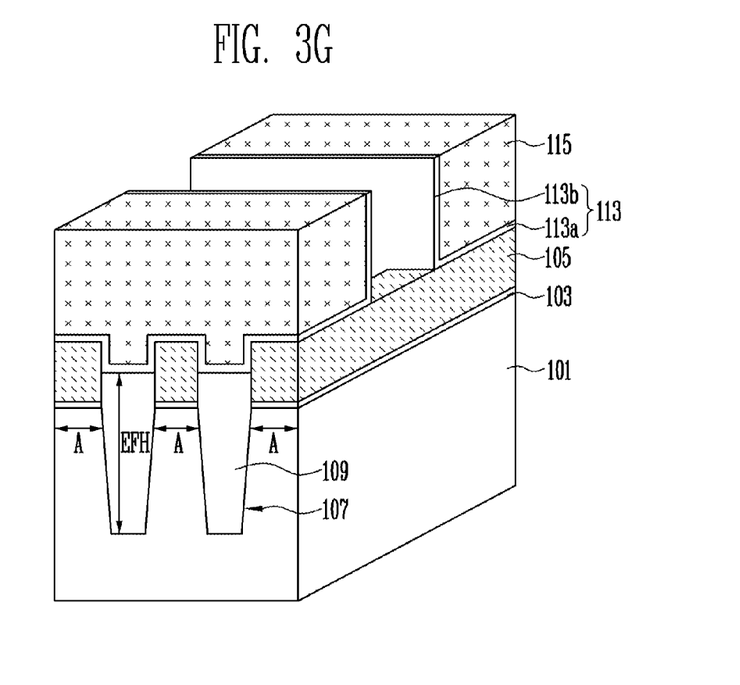

Referring to FIG. 3G, the charge trap layer 105 and the isolation insulation layer 109 are exposed by removing the auxiliary pattern 111a. The second dielectric layer 113b remains on the sidewall of the control gate layer 115 after the auxiliary pattern 111a is removed.

Figure 3H:
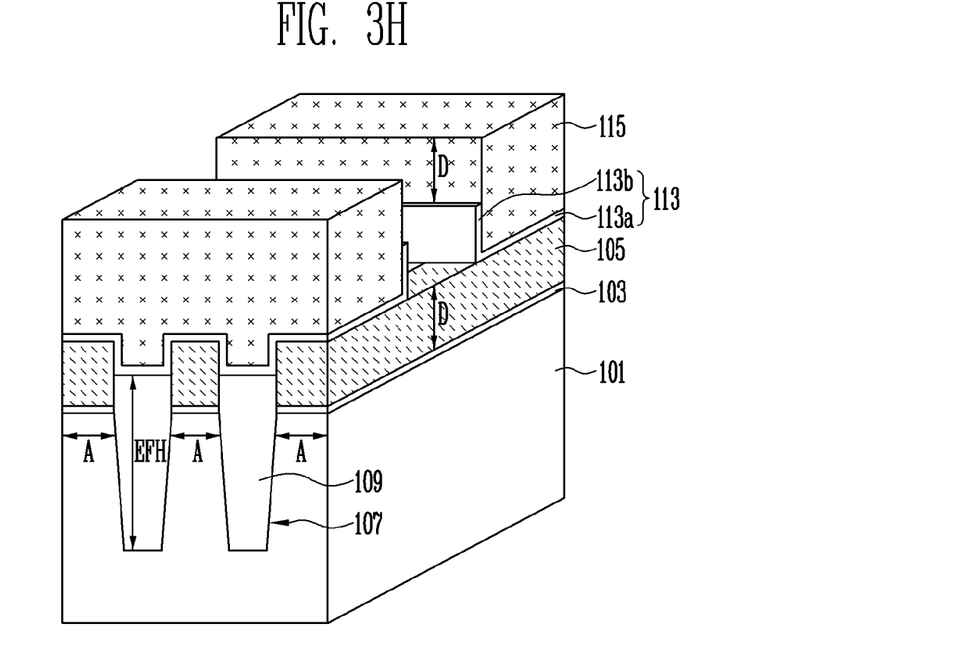

Referring to FIG. 3H, the second dielectric layer 113b is etched such that the sidewall of the control gate layer 115 is exposed from the top of the control gate layer 115 by a thickness D equal to the thickness of the charge trap layer 105. To this end, the second dielectric layer 113b is etched, preferably using an anisotropic dry etch method. Although not shown, the second dielectric layer 113b may be fully removed by etching the second dielectric layer 113b using a wet etch method.

Figure 3I:
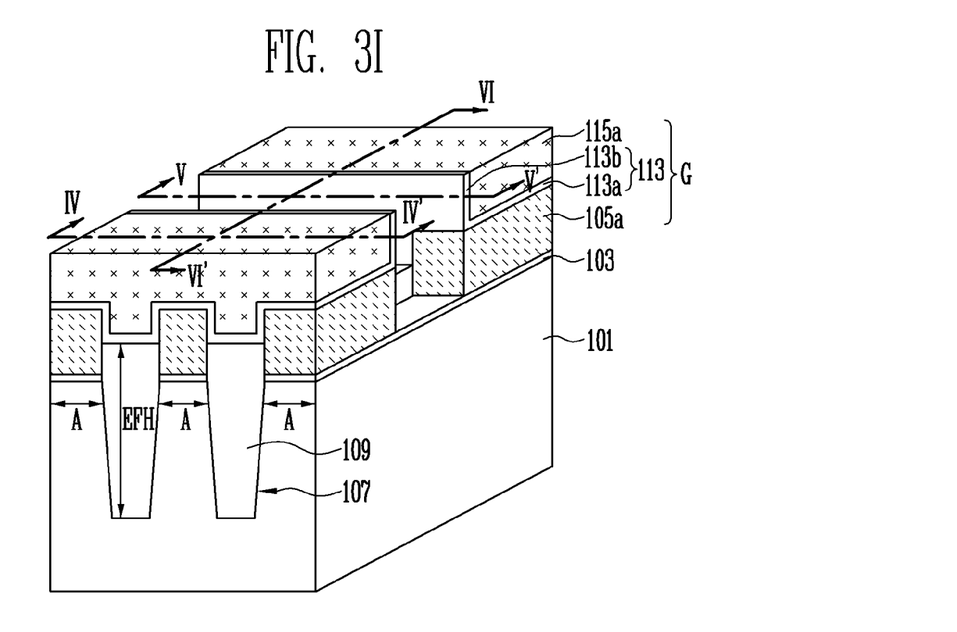

Referring to FIG. 3I, the exposed portion of the charge trap layer 105 is removed by an etch process using the control gate layer 115 and the second dielectric layer 113b as an etch mask, thereby forming a plurality of charge trap layer patterns 105a spaced apart from each other not only in the lateral direction, but also in the longitudinal direction. The charge trap layer 105 and the control gate layer 115 preferably comprise polysilicon as described above. Accordingly, when the etch process of forming the charge trap layer pattern 105a is performed, the control gate layer 115 is etched, thereby reducing the thickness of the control gate layer 115. Consequently, control gate patterns 115a forming respective gate patterns G are finally formed. The control gate patterns 115a are spaced apart from each other in the longitudinal direction. Each of the control gate patterns 115a is extended along the lateral direction.

Furthermore, the etch process of forming the charge trap layer patterns 105a using the etch material (i.e., the polysilicon layer), having a high etch selectivity for the dielectric layer 113, is performed. Accordingly, the height of the second dielectric layer 113b from the top of the charge trap layer pattern 105a may be equal to the height of the control gate pattern 115a from the top of the charge trap layer pattern 105a.

The second dielectric layer 113b may be removed by the etch process described with reference to FIG. 3H according to circumstances. The second dielectric layer 113b, preferably comprising a nitride layer, remains on the sidewalls of the control gate patterns 115a. Accordingly, the sidewalls of the control gate patterns 115a can be prevented from being lost through the second dielectric layer 113b when the etch process of forming the charge trap layer patterns 105a is performed, and thus the critical dimension of the control gate patterns 115a can be prevented from being lost.

Meanwhile, in the case where the dielectric layer 113 has a stack structure of a first oxide layer, a nitride layer, and a second oxide layer, the dielectric layer 113 preferably is etched using phosphoric acid.

Through the processes described above with reference to FIGS. 3A to 3I, the gate patterns G of the NAND flash memory device include the plurality of charge trap layer patterns 105a longitudinally spaced apart from each other on the tunnel insulating layer 103 over the active regions A, the first dielectric layer 113a formed on the charge trap layer patterns 105a and the isolation structures, the control gate patterns 115a formed on the first dielectric layer 113a and longitudinally spaced apart from each other, and the second dielectric layer 113b laterally formed on the sidewalls of the control gate patterns 115a and coupled to the first dielectric layer 113a.

Figure 3J:
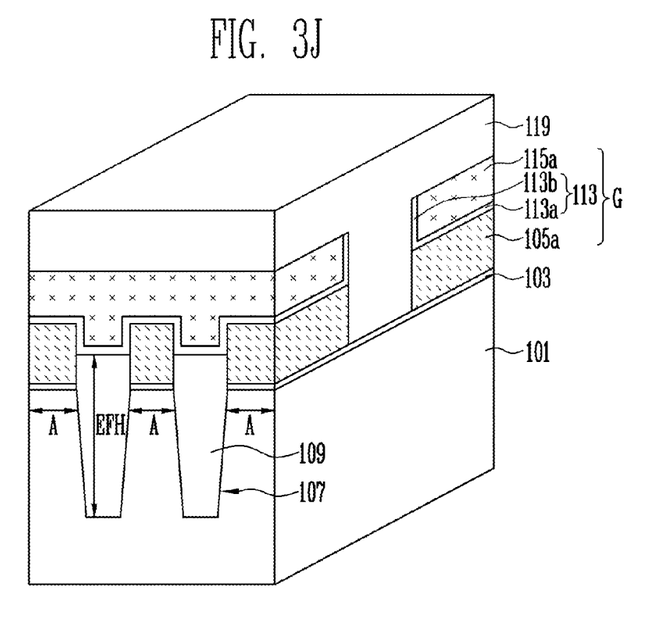

After the gate patterns G are formed, a re-oxidization process for eliminating damage generated on the sidewalls of the charge trap layer patterns 105a and subsequent processes of, for example, forming a dielectric interlayer 119 on the entire surface as shown in FIG. 3J preferably are performed.

Figure 4A:
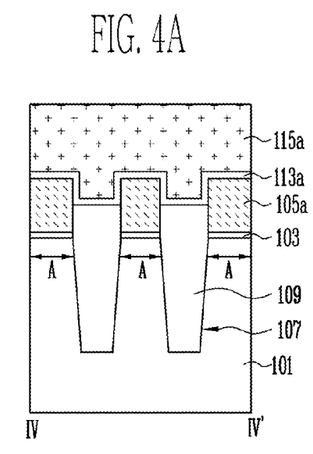
FIG. 4 is a cross-sectional view taken along lines IV-IV', V-V', and VI-VI'in FIG. 3I.
Figure 4B:
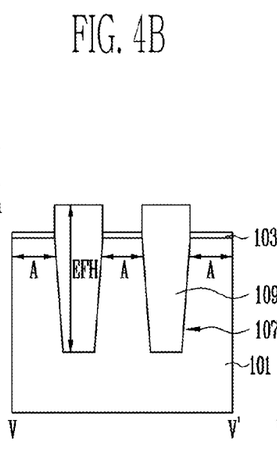
Figure 4C:
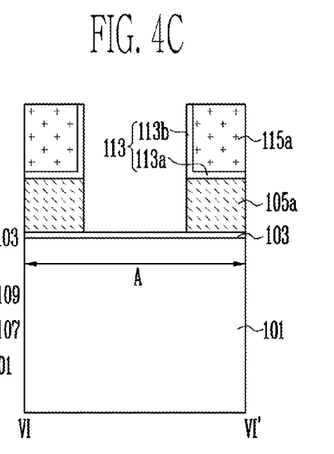

FIGS. 4A, 4B, and 4C are cross-sectional views taken along lines IV-IV', V-V', and VI-VI', respectively, in FIG. 3I.

Referring to FIGS. 4A, 4B, and 4C, in the first exemplary embodiment of this disclosure, an unnecessary region of the dielectric layer 113 is not formed on the sidewall of the charge trap layer pattern 105a. Accordingly, in a process of removing the unnecessary region of the dielectric layer, a dielectric fence is not formed on the sidewall of the charge trap layer pattern 105a.

In the first exemplary embodiment of this disclosure, since a dielectric fence is not formed on the sidewall of the charge trap layer pattern 105a, the dielectric layer 113 need not be excessively etched to remove the dielectric fence. Accordingly, the loss of the EFH of the isolation structure which may be caused by the excessive etch process of the dielectric layer can be improved.

FIGS. 5A to 5F are diagrams illustrating the patterns of a nonvolatile memory device and a method of forming the same according to a second exemplary embodiment of this disclosure. In particular, FIGS. 5A to 5F illustrate the gate patterns of a NAND flash memory device and a method of forming the same.

Figure 5A:
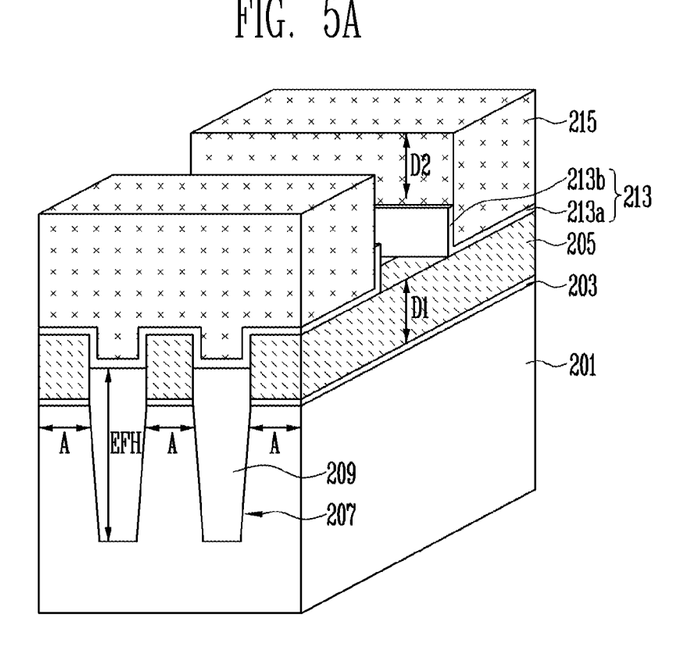

Referring to FIG. 5A, in the second exemplary embodiment of this disclosure, active regions A may be defined and extend in the longitudinal direction between a plurality of isolation structures spaced apart from each other in the lateral direction and a semiconductor substrate 201 in which a tunnel insulating layer 203 and a charge trap layer 205 are stacked over the active regions A may be provided, using the same method as described above with reference to FIG. 3A.

Next, the EFH of an isolation insulation layer 209 constituting each of isolation structures is controlled using the same method as described above with reference to FIGS. 3B and 3C.

Next, first control gate layers 215 spaced apart from each other in the longitudinal direction are formed using the same method as described with reference to FIGS. 3D to 3G. Next, there remain a first dielectric layer 213a formed over the isolation insulation layer 209 under the first control gate layer 215 and on the top and sidewall of the charge trap layer 205 under the first control gate layer 215, from the dielectric layer 213, and a second dielectric layer 213b formed on the sidewall of the first control gate layer 215 along the lateral direction. The first control gate layer 215 correspond to the control gate layer 115 of FIGS. 3D to 3G. Next, auxiliary patterns (not shown) are removed.

After the auxiliary patterns are removed, to increase the area in which a metal layer deposited in a subsequent process and the first control gate layer 215 come into contact with each other, the second dielectric layer 213b is etched so that the sidewall of the first control gate layer 215 is exposed by a second thickness D2 thicker than the first thickness D1 of the charge trap layer 205 from the top of the first control gate layer 215, as shown in FIG. 5A. In an alternative embodiment, the second dielectric layer 213b may be etched so that the sidewall of the first control gate layer 215 is exposed by the same thickness as the first thickness D1 of the charge trap layer 205 from the top of the first control gate layer 215. To this end, the second dielectric layer 213b may be etched, preferably using an anisotropic dry etch method. Although not shown, the second dielectric layer 213b may be fully removed by etching the second dielectric layer 213b using a wet etch method.

Figure 5B:
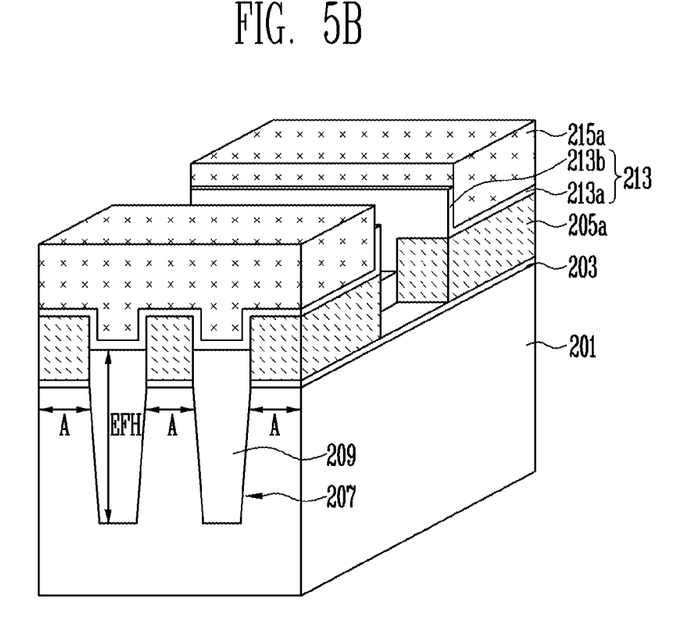

Referring to FIG. 5B, a plurality of charge trap layer patterns 205a is formed by removing the exposed portion of the charge trap layer through an etch process using the first control gate layer 215 and the second dielectric layer 213b as an etch mask. The charge trap layer patterns 205a are spaced apart from each other not only in the lateral direction, but also in the longitudinal direction. The charge trap layer 205 and the first control gate layer 215 preferably comprise polysilicon as described above. Accordingly, the first control gate layer 215 is etched when the etch process of forming the charge trap layer patterns 205a is performed, so that the thickness of the first control gate layer 215 removes identical with the first thickness D1. Next, first control gate patterns 215a are formed. The first control gate pattern 215a functions to generate a metal silicide layer through a reaction with the metal layer in a subsequent process. The first control gate patterns 215a are spaced apart from each other in the longitudinal direction.

Furthermore, before the etch process of the charge trap layer 205, the first control gate layer 215 was exposed in the second thickness D2 thicker than the first thickness D1. Although the thickness of the first control gate layer 215 remains identical with the first thickness D1 after the etch process of the charge trap layer 205, the first control gate pattern 215a remains higher than the second dielectric layer 213b. Consequently, some of the sidewall of the first control gate pattern 215a may be exposed.

As described above, the second dielectric layer 213b including the nitride layer remains on the sidewall of the first control gate pattern 205a. Accordingly, when the etch process of forming the charge trap layer patterns 205a is performed, damage to the sidewall of the first control gate pattern 215a due to the second dielectric layer 213b can be improved, and the loss of the critical dimensions of the first control gate pattern 215a can be improved.

Figure 5C:
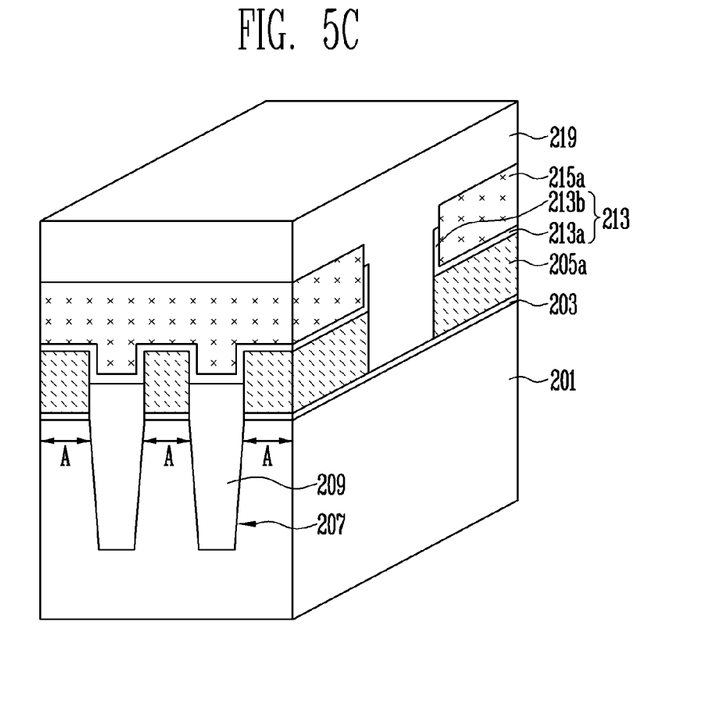

Referring to FIG. 5C, a first dielectric interlayer 219 having a thickness sufficient to fill the space between the charge trap layer patterns 205a and the space between the first control gate patterns 215a is formed on the entire surface. The first dielectric interlayer 219 preferably comprises an oxide layer.

Figure 5D:
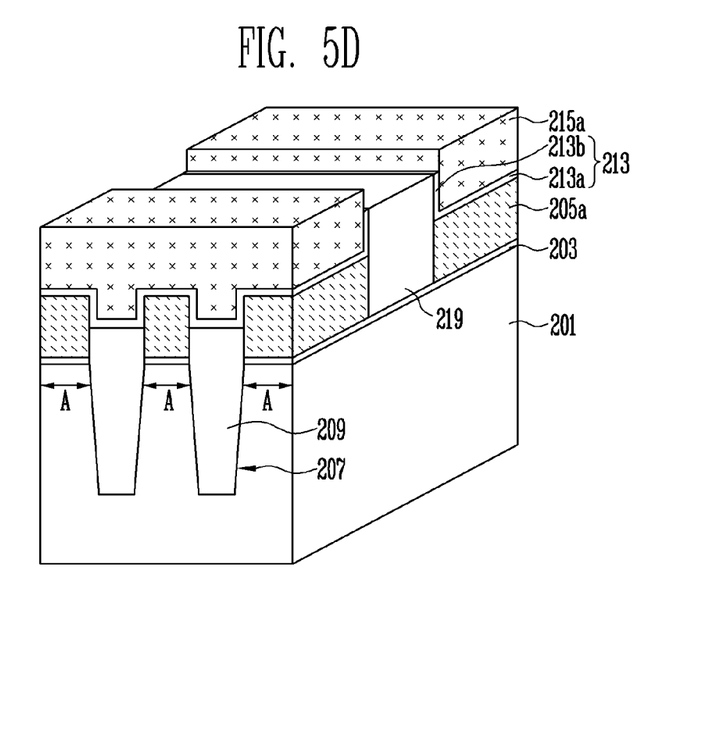

Referring to FIG. 5D, the first dielectric interlayer 219 is etched to expose the first control gate pattern 215a. Here, only the top of the first control gate pattern 215a may be exposed by polishing the first dielectric interlayer 219, preferably using Chemical Mechanical Polishing (CMP) until the first control gate pattern 215a is exposed. Alternatively, after the polishing process, an etch process, such as an etch-back process, may be further performed, thereby lowering the height of the first dielectric interlayer 219 and exposing the sidewall of the first control gate pattern 215a.

The second dielectric layer 213b remaining on the sidewall of the first control gate pattern 215a includes the nitride layer. When the etch process of the first dielectric interlayer 219 is performed to expose the sidewall of the first control gate pattern 215a, the second dielectric layer 213b may function as an etch-stop layer for stopping the etch process because of a difference in the etch selectivity between the second dielectric layer 213b and the first dielectric interlayer 219 formed of an oxide layer. Accordingly, the exposed area of the first control gate pattern 215a can be regularly controlled upwardly from the second dielectric layer 213b through the second dielectric layer 213b, and the sidewall of the first control gate pattern 215a can be prevented from being excessively exposed. Furthermore, the first dielectric interlayer 219 can be prevented from being excessively removed between the first control gate patterns 215a. Consequently, the first control gate patterns 215a and subsequent control gate patterns, each configured to have a stack structure and formed of a silicide layer to be formed in a subsequent process, can be more effectively supported by the first dielectric interlayer 219 and the second dielectric layer 213b which remains behind.

Meanwhile, in this disclosure, the first control gate patterns 215a remain higher than the second dielectric layer 213b, and the etch process of the first dielectric interlayer 219 is stopped when the second dielectric layer 213b is exposed. Accordingly, after the etch process of the first dielectric interlayer 219, some of the sidewall of the first control gate pattern 215a can be exposed.

Figure 5E:
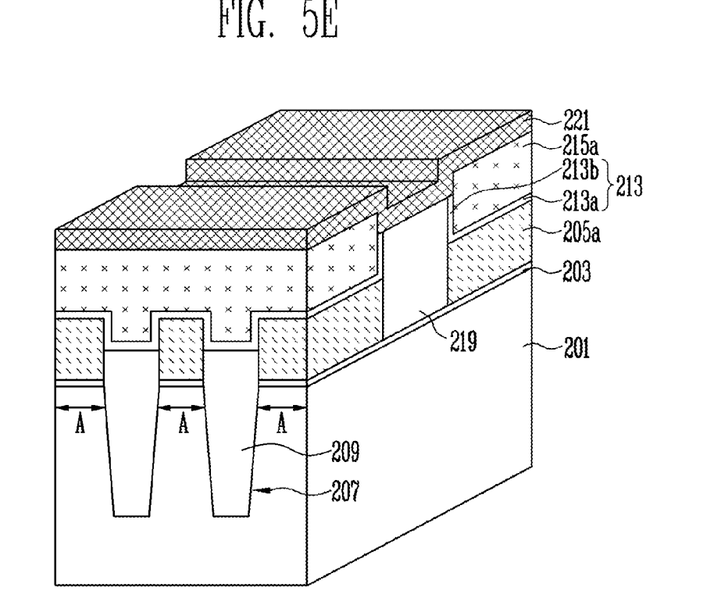

Referring to FIG. 5E, a metal layer 221 is formed on the entire surface so that the metal layer 221 comes into contact with the exposed top and sidewall of the first control gate pattern 215a.

The metal layer 221 preferably is deposited to form a metal silicide layer, having lower resistance than polysilicon, in a subsequent process through a reaction with the first control gate patterns 215a made of polysilicon. The metal layer 221 preferably comprises cobalt (Co). Meanwhile, a TiN layer for preventing the oxidization of the metal layer 221 and a Ti layer for preventing cohesion in an annealing process for forming the metal silicide layer preferably is further deposited over the metal layer 221.

In the second exemplary embodiment of this disclosure, since the sidewall of the first control gate pattern 215a is exposed, the contact area between the first control gate pattern 215a and the metal layer 221 can be increased. Accordingly, the height occupied by the metal silicide layer, from the height of a gate pattern, can be increased, and thus the resistance of the gate pattern can be improved more effectively.

Figure 5F:
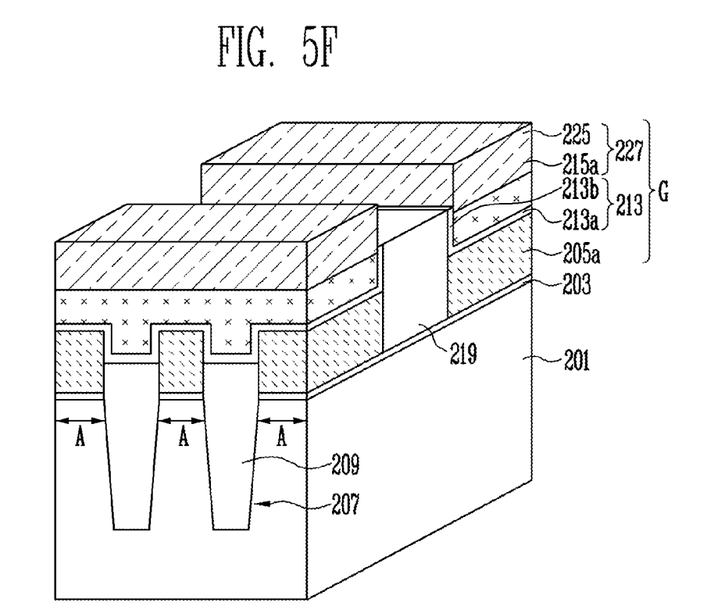

Referring to FIG. 5F, an annealing process preferably is performed so that the metal layer can react to the first control gate patterns 215a. Thus, the metal silicide layer 225 (i.e., a second control gate layer) is formed on the first control gate pattern 215a. The metal silicide layer 225 formed in the case where a cobalt (Co) layer is used as the metal layer is a cobalt silicide ($CoSi_2$) layer.

The annealing process for forming the metal silicide layer 225 may be divided into a first annealing process and a second annealing process. For example, a case where the cobalt silicide ($CoSi_2$) layer is formed is described in detail below. The cobalt silicide layer of a CoSi phase preferably is formed by performing the first annealing process at a first temperature. Next, the cobalt silicide layer of the CoSi phase is converted into a cobalt silicide layer of a $CoSi_2$ phase, preferably by performing the second annealing process at a second temperature higher than the first temperature. The cobalt silicide layer of the $CoSi_2$ phase is more stable than the cobalt silicide layer of a CoSi, and it has lower resistance than the cobalt silicide layer of the CoSi.

After the metal silicide layer 225 is formed, the metal layer, the TiN layer, and the Ti layer remaining without reaction are removed, preferably by a strip process. Accordingly, the gate patterns G, including the metal silicide layer 225 for low-resistance wiring, are formed.

Through the processes described with reference to FIGS. 5A to 5F, the gate patterns G of the NAND flash memory device include the plurality of charge trap layer patterns 205a longitudinally spaced apart from each other on the tunnel insulating layer 203 over the active regions A, the first dielectric layer 213a formed on the charge trap layer patterns 205a and the isolation structures, a plurality of control gate patterns 227 formed on the first dielectric layer 213a and longitudinally spaced apart from each other, and the second dielectric layer 213b formed on the sidewall of the control gate pattern 227 along the lateral direction and coupled to the first dielectric layer 213a. Furthermore, the control gate pattern 227 includes the first control gate pattern 215a and the metal silicide layer 225 stacked over the first dielectric layer 213a. Furthermore, the height of the second dielectric layer 213b from the top of the charge trap layer pattern 205a is lower than the height of the control gate pattern 227 from the top of the charge trap layer pattern 205a.

After the gate patterns G are formed, a subsequent process of, for example, forming a second dielectric interlayer (not shown) on the entire surface is performed.

In the second exemplary embodiment of this disclosure, an unnecessary region of the dielectric layer is not formed on the sidewall of the charge trap layer. Accordingly, a dielectric fence is not formed on the sidewall of the charge trap layer.

In the second exemplary embodiment of this disclosure, since a dielectric fence is not formed on the sidewall of the charge trap layer as described above, the dielectric layer needs not to be excessively etched to remove a dielectric fence. Accordingly, a phenomenon in which the EFH of the isolation structure is lost because of an excessive etch process for the dielectric layer can be improved.

In the second exemplary embodiment of this disclosure, the second dielectric layer remains on the sidewall of the first control gate pattern. Accordingly, the metal silicide layer can be prevented from being excessively formed, and supporting power to prevent the control gate patterns from collapsing can be secured.

As described above, according to the present disclosure, a dielectric fence is not formed on the sidewall of the charge trap layer, and the loss of the EFH of the isolation structure can be improved. Accordingly, the failure of a device resulting from the dielectric fence and the loss of the EFH of the isolation structure can be improved.

What is claimed is:

1. Nonvolatile memory device, comprising:
a semiconductor substrate including active regions extending in a longitudinal direction;
an isolation structure formed between the active regions;
a tunnel insulating layer formed on the active regions;
a charge trap layer formed on the tunnel insulating layer;
a first dielectric layer formed on the charge trap layer and the isolation structure, wherein the first dielectric layer extends along a lateral direction;
a control gate layer formed on the first dielectric layer, wherein the control gate layer is extended along the lateral direction; and
a second dielectric layer formed on a sidewall of the control gate layer along the lateral direction and coupled to the first dielectric layer.

2. The nonvolatile memory device of claim 1, wherein a part of the isolation structure, which is covered by the control gate layer, is higher than the tunnel insulating layer, and lower than a top surface of the charge trap layer.

3. The nonvolatile memory device of claim 2, wherein the first dielectric layer is extended and formed on a sidewall of the charge trap layer protruding higher than the isolation structure.

4. The nonvolatile memory device of claim 1, wherein the first and second dielectric layers comprise a nitride layer.

5. The nonvolatile memory device of claim 1, wherein a height of the second dielectric layer from the charge trap layer is equal to or lower than a height of the control gate layer.

6. The nonvolatile memory device of claim 1, wherein the control gate layer comprises a polysilicon layer and a metal silicide layer stacked over the first dielectric layer.

7. The nonvolatile memory device of claim 6, wherein the metal silicide layer comprises cobalt silicide ($CoSi_2$) layer.

8. The nonvolatile memory device of claim 1, wherein the first dielectric layer and the second dielectric layer are formed of a same material.

* * * * *